(12) United States Patent
Wu et al.

(10) Patent No.: US 10,908,448 B1
(45) Date of Patent: Feb. 2, 2021

(54) DISPLAY APPARATUS

(71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (TW)

(72) Inventors: Chin-Yang Wu, Guangdong (CN); Tsung-Chen Chou, Guangdong (CN); Tsung-Ju Hu, Guangdong (CN); Yau-Yang Jung, Guangdong (CN); Wen-Hsiao Huang, Guangdong (CN)

(73) Assignees: INTERFACE TECHNOLOGY (CHENGDU) CO., LTD., Sichuan (CN); INTERFACE OPTOELECTRONICS (SHENZHEN) CO., LTD., Guangdong (CN); GENERAL INTERFACE SOLUTION LIMITED, Miaoli County (TW)

( * ) Notice: Subject to any disclaimer, the term of this patent is extended or adjusted under 35 U.S.C. 154(b) by 0 days.

(21) Appl. No.: 16/741,766

(22) Filed: Jan. 14, 2020

(30) Foreign Application Priority Data

Oct. 25, 2019 (CN) .......................... 2019 1 1022643

(51) Int. Cl.
*G02F 1/1335* (2006.01)
*G02F 1/1333* (2006.01)
(Continued)

(52) U.S. Cl.
CPC .. *G02F 1/133502* (2013.01); *G02F 1/133308* (2013.01); *H05K 5/0017* (2013.01);
(Continued)

(58) Field of Classification Search
CPC ........ G02F 2001/133331; G02F 2001/133311; G02F 2001/133314; G02F 2001/133317;
(Continued)

(56) References Cited

U.S. PATENT DOCUMENTS

| | | | | |
|---|---|---|---|---|
| 2008/0018823 A1* | 1/2008 | Wang | ................ | G02F 1/133308 349/58 |
| 2011/0261282 A1* | 10/2011 | Jean | .................. | G02F 1/133308 349/58 |

(Continued)

*Primary Examiner* — Bryon T Gyllstrom
*Assistant Examiner* — James M Endo
(74) *Attorney, Agent, or Firm* — CKC & Partners Co., LLC

(57) ABSTRACT

A display apparatus includes a panel, a backlight module, a cover, an integrated plastic frame and an optical adhesive. The panel is disposed over the backlight module. The cover is disposed over the panel, which is located between the cover and the backlight module. The integrated plastic frame includes a first accommodating portion, a second accommodating portion and an adhesive-restricting portion. The second accommodating portion is coupled between the first accommodating portion and the adhesive-restricting portion. The combination of the first accommodating portion, the second accommodating portion and the adhesive-restricting portion is integrally formed. The first accommodating portion accommodates at least a portion of the backlight module, the second accommodating portion accommodates the panel, and the adhesive-restricting portion is coupled between the second accommodating portion and the cover to define an accommodating space together with the cover and the panel. The optical adhesive is disposed in the accommodating space.

10 Claims, 4 Drawing Sheets

(51) Int. Cl.
*H05K 5/00* (2006.01)
*H05K 5/03* (2006.01)
*G02F 1/13357* (2006.01)
*G06F 3/041* (2006.01)

(52) U.S. Cl.
CPC .............. *H05K 5/03* (2013.01); *G02F 1/1336* (2013.01); *G02F 1/13338* (2013.01); *G02F 2001/133331* (2013.01); *G06F 3/041* (2013.01)

(58) Field of Classification Search
CPC .......... G02F 2001/13332; G02F 2001/133325; G02F 1/133308; G02F 1/1336; G02F 1/13338
See application file for complete search history.

(56) References Cited

U.S. PATENT DOCUMENTS

| | | | |
|---|---|---|---|
| 2012/0162565 A1* | 6/2012 | Lee | G02F 1/133308 349/58 |
| 2012/0242926 A1* | 9/2012 | Hsu | G02F 1/133308 349/58 |
| 2012/0307183 A1* | 12/2012 | Schultz | G02F 1/133308 349/84 |
| 2013/0003339 A1* | 1/2013 | Chen | A47B 81/06 361/807 |
| 2013/0076704 A1* | 3/2013 | Song | H04N 13/10 345/204 |
| 2013/0094160 A1* | 4/2013 | Narumi | G02F 1/133308 361/752 |
| 2013/0208510 A1* | 8/2013 | Takashima | G02B 6/0091 362/615 |
| 2014/0043559 A1* | 2/2014 | Lee | G02B 6/0081 349/58 |
| 2014/0092339 A1* | 4/2014 | Yoshimura | G02F 1/133308 349/58 |
| 2015/0077657 A1* | 3/2015 | Ma | G02F 1/13338 349/12 |
| 2015/0351272 A1* | 12/2015 | Wildner | H01L 27/3244 361/679.21 |
| 2015/0366082 A1* | 12/2015 | Jang | G06F 1/1601 361/679.01 |
| 2016/0085112 A1* | 3/2016 | Takase | F21V 15/01 349/58 |
| 2016/0116788 A1* | 4/2016 | Samurada | G02B 6/0055 349/58 |
| 2016/0131934 A1* | 5/2016 | Hwang | G02F 1/13338 257/59 |
| 2016/0259203 A1* | 9/2016 | Nishimoto | G02F 1/133308 |
| 2016/0356979 A1* | 12/2016 | Zhang | G02F 1/133308 |
| 2017/0052562 A1* | 2/2017 | Yamawaki | G02F 1/1333 |
| 2018/0011353 A1* | 1/2018 | Wang | G02F 1/133308 |
| 2018/0039127 A1* | 2/2018 | Eom | G02F 1/13338 |
| 2018/0065881 A1* | 3/2018 | Hashimoto | C03C 3/076 |
| 2018/0210489 A1* | 7/2018 | Boisard | B32B 27/365 |

* cited by examiner

DISPLAY APPARATUS

CROSS-REFERENCE TO RELATED APPLICATION

This application claims priority to China application No. 201911022643.5 filed on Oct. 25, 2019, which is herein incorporated by reference in its entirety.

BACKGROUND

Field of Invention

The present disclosure relates to a display apparatus. More particularly, the present disclosure relates to a display apparatus including an integrated plastic frame.

Description of Related Art

Optical adhesives, such as optical clear resins (OCR), are special adhesives designed for the binding of transparent components. The optical adhesive fills a gap formed between a panel and a transparent cover to enhance a contrast of a display apparatus. Compared with a traditional air gap method, the optical adhesive can reduce light scattering caused by external illumination or backlight, and is suitable for adhering and assembly between touch screens, large-size glass substrates or other soft boards and hard boards.

In a conventional adhesive filling operation of the display apparatus, it is necessary to provide an external frame as a frame for adhesive filling, and then an optical adhesive (for example, an optical transparent resin) can be injected into a space formed between the external frame and the cover. However, the conventional external frame has its limitations in application. For example, it is not applicable to an open cell which does not have a front iron frame, because such open cell has no front iron frame to adhere to the external frame, and a periphery of the open cell also cannot provide enough space to adhere to the external frame. In addition, a material requirement of the external frame and an assembly procedure between the external frame and a liquid crystal display module (LCM) are also a burden on a process of the liquid crystal display device.

SUMMARY

An object of the present disclosure is to provide a display apparatus, in which a frame for adhesive filling and a plastic frame of a backlight module are integrally formed into an integrated plastic frame, thereby simplifying an assembly procedure and increasing product competitiveness.

According to the object of the disclosure, a display apparatus is provided, and includes a panel, a backlight module, a cover, an integrated plastic frame and an optical adhesive. The panel is disposed over the backlight module. The cover is disposed over the panel, and the panel is located between the cover and the backlight module. The integrated plastic frame includes a first accommodating portion, a second accommodating portion and an adhesive-restricting portion. The second accommodating portion is connected between the first accommodating portion and the adhesive-restricting portion. A combination of the first accommodating portion, the second accommodating portion and the adhesive-restricting portion is an integrally formed structure. The first accommodating portion accommodates at least one portion of the backlight module, the second accommodating portion accommodates the panel, and the adhesive-restricting portion is connected between the second accommodating portion and the cover to define an accommodating space together with the cover and the panel. The optical adhesive is disposed in the accommodating space.

In some embodiments, the panel comprises a display panel, a touch display panel, or a touch panel and a display panel attached to each other.

In some embodiments, the cover is a flat plate structure or a curved plate structure.

In some embodiments, the adhesive-restricting portion is an annular structure.

In some embodiments, one side of the cover adjacent to the adhesive-restricting portion comprises a first inclined surface, one side of the adhesive-restricting portion adjacent to the cover comprises a second inclined surface, and the first inclined surface and the second inclined surface match each other in shape.

In some embodiments, a connecting member is disposed between the cover and the adhesive-restricting portion to connect the cover and the adhesive-restricting portion.

In some embodiments, a connecting member is disposed between the panel and the second accommodating portion to connect the panel and the second accommodating portion.

In some embodiments, the adhesive-restricting portion comprises at least one rib reinforcement structure, and the rib reinforcement structure is located on an inner side of the adhesive-restricting portion and contacts the optical adhesive.

In some embodiments, the adhesive-restricting portion comprises at least one rib reinforcement structure, and the rib reinforcement structure is located on an outer side of the adhesive-restricting portion.

In summary, in the display apparatus of the embodiments of the present disclosure, 3D features of the frame for adhesive filling are integrated into the plastic frame of the backlight module to produce an integrated plastic frame, such that a function of the frame for adhesive filling and a function of the plastic frame of the backlight module can be both achieved by one single plastic frame. These functions include accommodating the backlight module, accommodating the panel, and connecting the cover to form the accommodating space for the optical adhesive. Thus, the display apparatus of the embodiments of the present disclosure decreases a material requirement of the frame for adhesive filling, and omits a connecting procedure between the frame for adhesive filling and the liquid crystal display module. In addition, the integrated plastic frame of the embodiments of the present disclosure can be applied to a display panel which does not have a front iron frame. Therefore, the display apparatus of the embodiments of the present disclosure can simplify a process and enhance product competitiveness.

In order to make the above features and advantages of the present disclosure more apparent, the following embodiments are described in detail with reference to the accompanying drawings.

BRIEF DESCRIPTION OF THE DRAWINGS

Aspects of the present disclosure are best understood from the following detailed description in conjunction with the accompanying figures. In accordance with the standard practice in the industry, various features are not drawn to scale. In fact, the dimensions of the various features can be arbitrarily increased or reduced for clarity of discussion.

DETAILED DESCRIPTION

Figure 1:
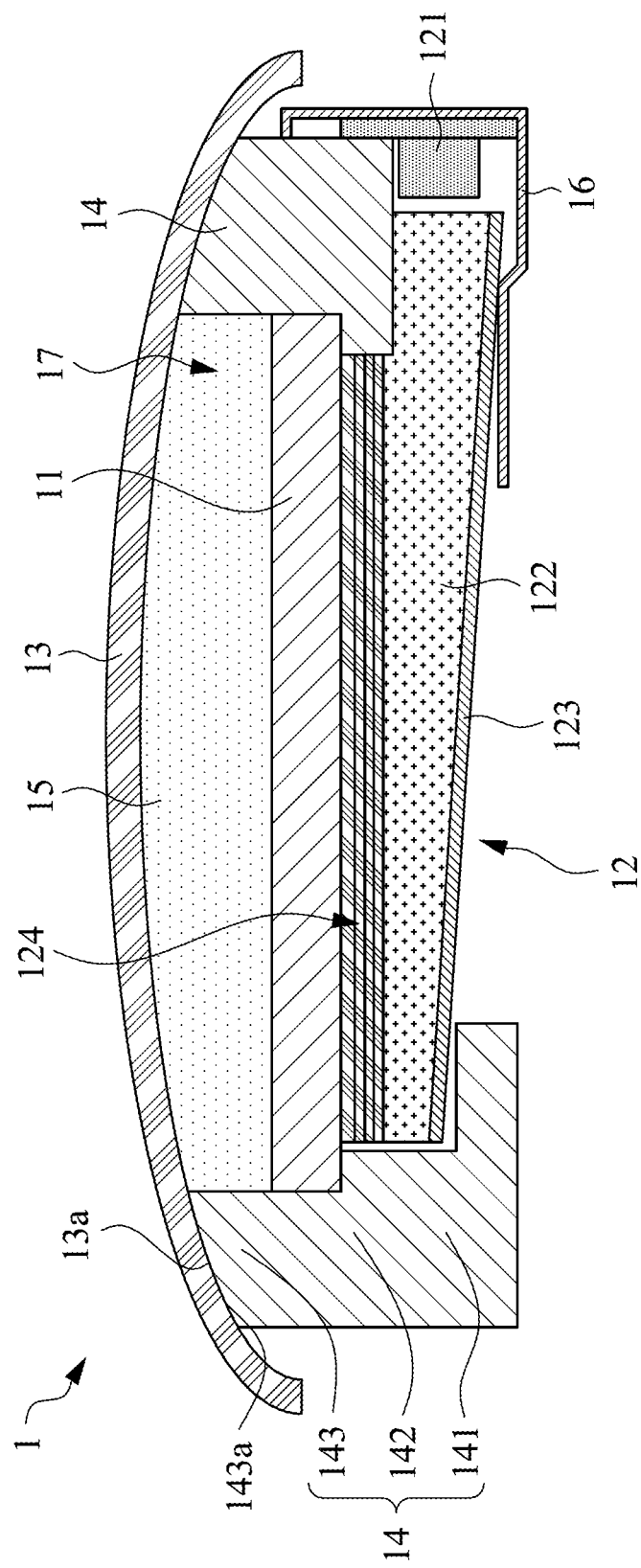
FIG. 1 is a schematic cross-sectional view of a display apparatus according to embodiments of the present disclosure.

The embodiments of the present disclosure are discussed in detail below. However, it will be appreciated that the embodiments provide many applicable concepts that can be implemented in a various specific contents. The embodiments discussed and disclosed are for illustrative purposes only and are not intended to limit the scope of the present disclosure. All of the embodiments of the present disclosure disclose various different features, and these features may be implemented separately or in combination as desired. In addition, the terms "first", "second", and the like, as used herein, are not intended to mean a sequence or order, and are merely used to distinguish elements or operations described in the same technical terms. Furthermore, the spatial relationship between two elements described in the present disclosure applies not only to the orientation depicted in the drawings, but also to the orientations not represented by the drawings, such as the orientation of the inversion. Moreover, the terms "connected", "coupled", "electrically connected" or the like between two components referred to in the present disclosure are not limited to the direct connection, coupling, or electrical connection of the two components, and may also include indirect connection, coupling, or electrical connection as required.

FIG. 1 is a cross-sectional side view of a display apparatus 1 according to embodiments of the disclosure. The embodiments of the disclosure do not limit the type of the display apparatus 1. The display apparatus 1 may be a flat display apparatus or a curved display apparatus, or a 2D display apparatus or a 3D display apparatus.

As shown in FIG. 1, the display apparatus 1 includes a panel 11, a backlight module 12, a cover 13, an integrated plastic frame 14, and an optical adhesive 15. The panel 11 is disposed over the backlight module 12. The panel 11 is, for example but not limited to, a liquid crystal display panel. The panel 11 of the present embodiment is a display panel which does not has a front iron frame for example. In other embodiments, a configuration of the panel 11 can be adjusted as needed. For example, the panel 11 may include a display panel, or a touch display panel, or a panel in which a touch panel (film) and a display panel are attached to each other. The aforementioned touch display panel means that a display panel includes a touch structure.

The backlight module 12 may be a direct-type or edge-type backlight module, and the edge-type backlight module is used as an example herein. In the present embodiment, the backlight module 12 includes, for example, a light source 121, a light guide plate 122, a reflective sheet 123, and an optical film set 124. The light source 121 is disposed adjacent to one side surface of the light guide plate 122 to emit light toward the light guide plate 122 from the side surface of the light guide plate 122. The light source 121 may be a point light source, a line light source or a surface light source. For example, the light source 121 may include a light emitting diode or another kind of electroluminescence (EL) element. The reflective sheet 123 is disposed at a bottom of the light guide plate 122 to reflect the light which is emitted to the bottom of the light guide plate 122 to the optical film set 124. The optical film set 124 is located over the light guide plate 122 and between the light guide plate 122 and the panel 11 to improve optical properties of the light or make the optical properties of the light meet the requirements. The optical film set 124 may include, for example, a diffusion film, a brightness enhancement film, a micro-lens optical film, or the like. The light passing through the optical film set 124 enters the panel 11 to form images. The aforementioned components included in the backlight module 12 are merely for the illustrative purpose but not for the limitation. In other embodiments, the components may be added, replaced, or omitted as needed.

The cover 13 is disposed over the panel 11, and the panel 11 is located between the cover 13 and the backlight module 12. The cover 13 can protect the panel 11 from external environmental pollution and external force. The optical adhesive 15 can be filled in a space between the cover 13 and the panel 11 to enhance the optical properties of the display apparatus 1. The optical adhesive 15 may be, for example, an optical clear resin. The cover 13 may be a flat plate structure or a curved plate structure, and the curved plate structure is used as an example herein.

The integrated plastic frame 14 of the embodiment of the present disclosure includes a first accommodating portion 141, a second accommodating portion 142, and an adhesive-restricting portion 143. The second accommodating portion 142 is connected between the first accommodating portion 141 and the adhesive-restricting portion 143, and the combination of the first accommodating portion 141, the second accommodating portion 142, and the adhesive-restricting portion 143 is an integrated structure. The first accommodating portion 141 accommodates at least one portion of the backlight module 12, which at least includes the light guide plate 122, the reflective sheet 123, and the optical film group 124 herein, for example. The second accommodating portion 142 accommodates the panel 11. In this embodiment, the integrated plastic frame 14 may include a stepped structure, for example, such that the first accommodating portion 141 and the second accommodating portion 142 can respectively carry the backlight module 12 and the panel 11. The adhesive-restricting portion 143 is connected between the second accommodating portion 142 and the cover 13 to define an accommodating space 17 together with the cover 13 and the panel 11. The optical adhesive 15 is disposed in the accommodating space 17. The adhesive-restricting portion 143 is an annular structure, such that a sealed accommodating space 17 can be formed by the adhesive-restricting portion 143, the cover 13 and the panel 11.

The adhesive-restricting portion 143 and the cover 13 can be connected to each other in many ways. For a direct connection, the adhesive-restricting portion 143 and the cover 13 may be connected to each other by engaging. For an indirect connection, a connecting member may be used to connect the adhesive-restricting portion 143 and the cover 13, and the connecting member may be a double-sided tape or an engaging structure. In this embodiment, one side of the cover 13 adjacent to the adhesive-restricting portion 143 has a first inclined surface 13a, and one side of the adhesive-restricting portion 143 adjacent to the cover 13 has a second inclined surface 143a, in which the first inclined surface 13a and the second inclined surface 143a match each other in shape, for example, they have complementary shapes. The shapes of the first inclined surface 13a and the second inclined surface 143a match each other, such that the first inclined surface 13a and the second inclined surface 143a can be connected to each other correspondingly, which facilitates the connection between the adhesive-restricting portion 143 and the cover 13.

In addition, the display apparatus 1 may further include a back plate 16, which is connected to the integrated plastic frame 14. In this embodiment, the light source 121 (including the light-emitting element and a circuit board) may be disposed on the back plate 16 and fixed to the back plate 16. Furthermore, the back plate 16 abuts and fixes the reflective sheet 123.

Figure 2:
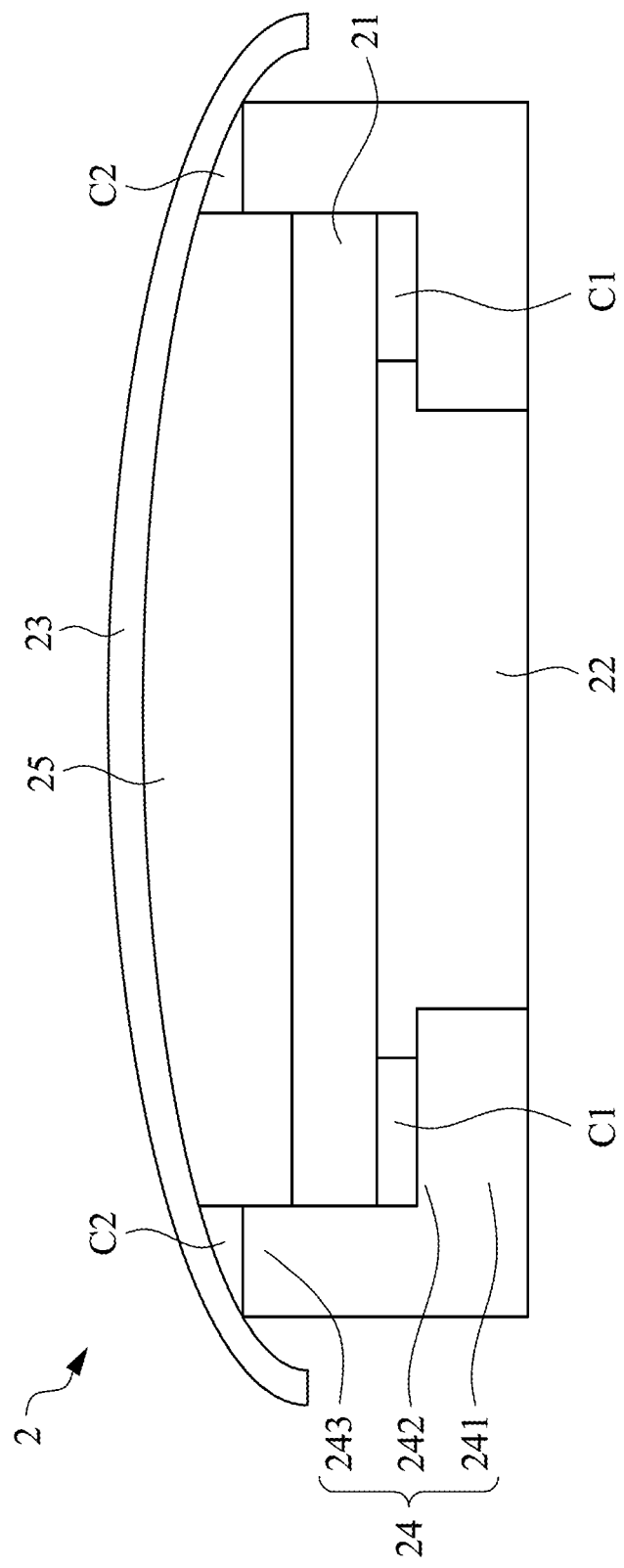
FIG. 2 is a schematic cross-sectional view of another display apparatus according to embodiments of the disclosure.

FIG. 2 is a schematic diagram of another display apparatus 2 according to embodiments of the present disclosure. As shown in FIG. 2, the display apparatus 2 includes a panel 21, a backlight module 22, a cover 23, an integrated plastic frame 24, and an optical adhesive 25. The integrated plastic frame 24 includes a first accommodating portion 241, a second accommodating portion 242, and an adhesive-restricting portion 243. The optical adhesive 25 is disposed in an accommodating space formed by the adhesive-restricting portion 243, the cover 23, and the panel 21. The technical features of the aforementioned components can be understood by referring to those of the embodiment shown in FIG. 1, so the details thereof are not described again for conciseness.

In addition, in the present embodiment, a connecting member C1 is disposed between the panel 21 and the second accommodating portion 242 to connect the panel 21 and the integrated plastic frame 24, in which the connecting member C1 may be, for example, a double-sided tape. Moreover, a connecting member C2 is disposed between the cover 23 and the adhesive-restricting portion 243 to connect the cover 23 and the integrated plastic frame 24, in which the connecting member C2 may be, for example, a double-sided tape. In this embodiment, one side of the adhesive-restricting portion 243 adjacent to the cover 23 is a flat surface, and the connecting member C2 is, for example, in a wedge shape, for facilitating the connecting of the cover 23 and the adhesive-restricting portion 243 of the integrated plastic frame 24. That is, the side of the connecting member C2 adjacent to the adhesive-restricting portion 243 is a flat surface, and the other side of the connecting member C2 adjacent to the cover 23 is an inclined surface.

Figure 3:
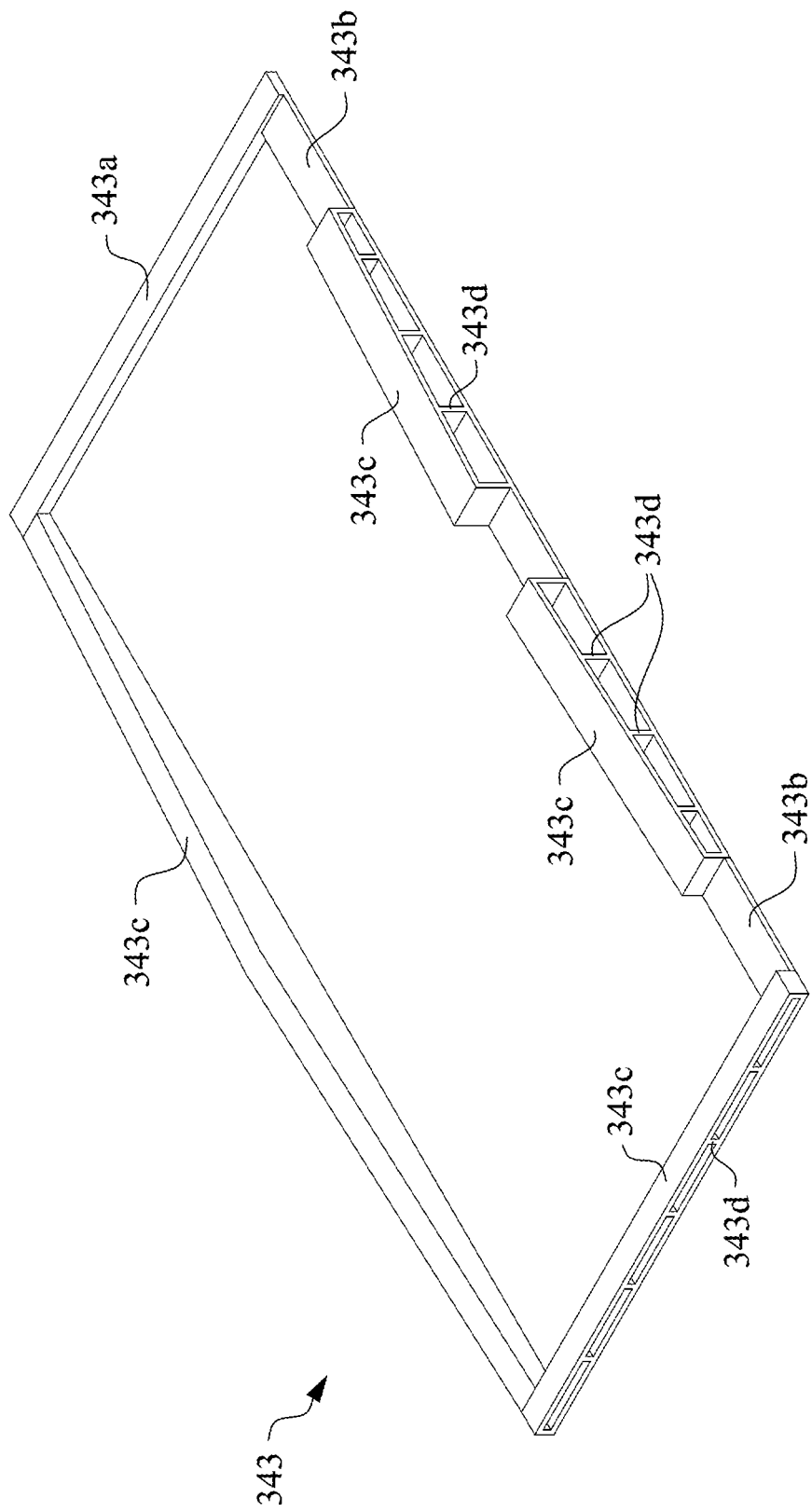
FIG. 3 is a schematic perspective diagram of an adhesive-restricting portion of an integrated plastic frame according to embodiments of the present disclosure, in which the adhesive-restricting portion includes a rib reinforcement structure.

FIG. 3 is a schematic diagram of an adhesive-restricting portion 343 of an integrated plastic frame according to embodiments of the present disclosure. The adhesive-restricting portion 343 may include the technical features of the adhesive-restricting portion 143 of FIG. 1 and/or the adhesive-restricting portion 243 of FIG. 2. As shown in FIG. 3, one side of the adhesive-restricting portion 343 adjacent to the cover includes 3D features to match the shape of the cover, thereby achieving a relatively tight connection between the adhesive-restricting portion 343 and the cover. The 3D features include, for example, a flat portion 343a, a recessed portion 343b, and/or a raised portion 343c. In addition, the adhesive-restricting portion 343 may further have at least one rib reinforcement structure 343d, and the rib reinforcement structure 343d may be located on an inner side or outer side of the adhesive-restricting portion 343. In this embodiment, the rib reinforcement structure 343d is located on the outer side for example. In the embodiment, the rib reinforcement structure 343d is located at the raised portion 343c for example. The rib reinforcement structure 343d can enhance the overall structural strength.

Figure 4:
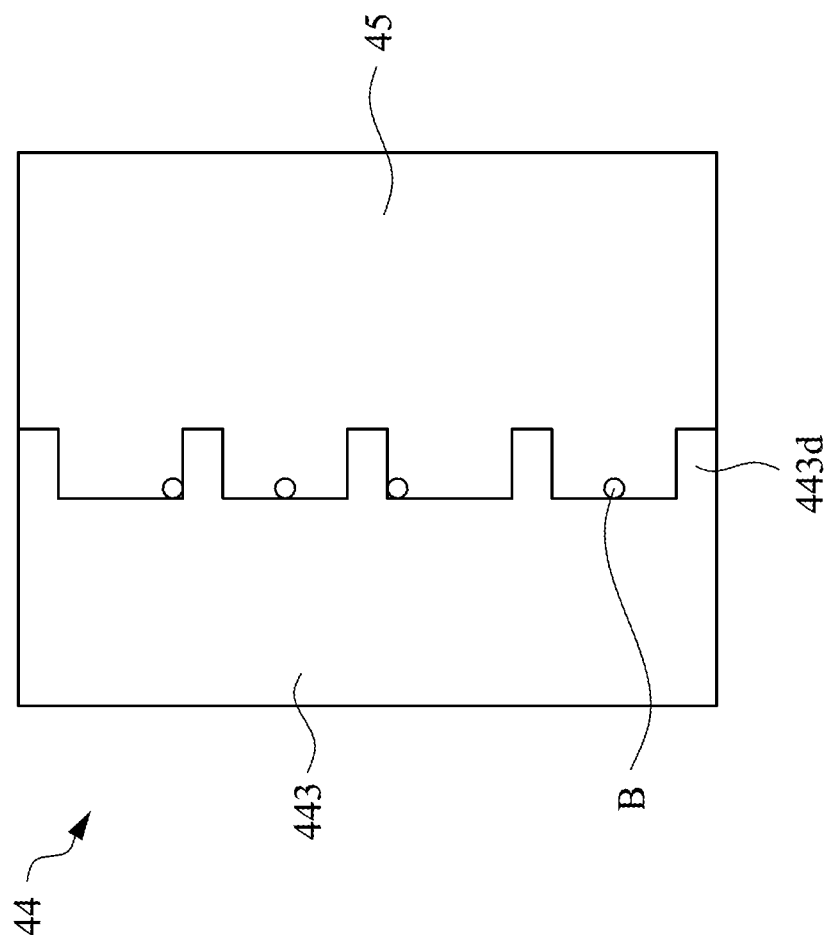
FIG. 4 is a schematic cross-sectional view of another rib reinforcement structure according to embodiments of the present disclosure.

FIG. 4 is a schematic diagram of another rib reinforcement structure 443d according to embodiments of the present disclosure. As shown in FIG. 4, the rib reinforcement structure 443d is located on an inner side of an adhesive-restricting portion 443 of an integrated plastic frame 44, and thus contacts an optical adhesive 45. In addition to enhancing the overall structural strength, the optical adhesive 45 flows into the rib reinforcement structure 443d to increase a contact area between the optical adhesive 45 and the adhesive-restricting portion 443, such that connection strength between the optical adhesive 45 and the adhesive-restricting portion 443 is increased, thereby enhancing the overall structural strength and reducing a possibility of peeling between the optical adhesive 45 and the adhesive-restricting portion 443. The injected optical adhesive 45 may generate bubbles B. When the bubbles B are generated, the bubbles B may be hidden in the rib reinforcement structure 443d, such that it can prevent display quality of the display apparatus from being affected. The bubbles B may include adhesive-filling bubbles and/or surrounding-side bubbles.

It can be seen from the above description that, in the display apparatus of the embodiments of the present disclosure, 3D features of the frame for adhesive filling are integrated into the plastic frame of the backlight module to produce an integrated plastic frame, such that a function of the frame for adhesive filling and a function of the plastic frame of the backlight module can be both achieved by one single plastic frame. These functions include accommodating the backlight module, accommodating the panel, and connecting the cover to form the accommodating space for the optical adhesive. Thus, the display apparatus of the embodiments of the present disclosure decreases a material requirement of the frame for adhesive filling, and omits a connecting procedure between the frame for adhesive filling and the liquid crystal display module. In addition, the integrated plastic frame of the embodiments of the present disclosure can be applied to a display panel which does not have a front iron frame. Therefore, the display apparatus of the embodiments of the present disclosure can simplify a process and enhance product competitiveness.

The features of several embodiments are outlined above, so those skilled in the art can understand the aspects of the present disclosure. Those skilled in the art will appreciate that the present disclosure can be readily utilized as a basis for designing or modifying other processes and structures, thereby achieving the same objectives and/or achieving the same advantages as the embodiments described herein. Those skilled in the art should also understand that these equivalent constructions do not depart from the spirit and scope of the present disclosure, and they can make various changes, substitutions and alteration without departing from the spirit and scope of this disclosure.

What is claimed is:

1. A display apparatus, comprising:
a backlight module;
a panel disposed over the backlight module;
a cover disposed over the panel, wherein the panel is located between the cover and the backlight module;
an integrated plastic frame comprising a first accommodating portion, a second accommodating portion and an adhesive-restricting portion, wherein the second accommodating portion is connected between the first accommodating portion and the adhesive-restricting portion, a combination of the first accommodating portion, the second accommodating portion and the adhesive-restricting portion is an integrally formed structure, the first accommodating portion accommodates at least one portion of the backlight module, the second accommodating portion accommodates the panel, and the adhesive-restricting portion is connected between the second accommodating portion and the cover to define an accommodating space together with the cover and the panel; and an optical adhesive disposed in the accommodating space, wherein one side of the adhesive-restricting portion adjacent to the cover comprises a plurality of 3D features, and the 3D features comprises at least one flat portion, at least one recessed portion, and at least one raised portion, and wherein the adhesive-restricting portion further comprises at least one first rib reinforcement structure located at the at least one raised portion, and the at least one first rib reinforcement structure is disposed on a side of the adhesive-restricting portion.

2. The display apparatus of claim 1, wherein the panel comprises a display panel, a touch display panel, or a touch panel and a display panel attached to each other.

3. The display apparatus of claim 1, wherein the cover is a flat plate structure or a curved plate structure.

4. The display apparatus of claim 1, wherein the adhesive-restricting portion is an annular structure.

5. The display apparatus of claim 1, wherein one side of the cover adjacent to the adhesive-restricting portion comprises a first inclined surface, one side of the adhesive-restricting portion adjacent to the cover comprises a second inclined surface, and wherein the first inclined surface and the second inclined surface match each other in shape.

6. The display apparatus of claim 1, wherein a connecting member is disposed between the cover and the adhesive-restricting portion to connect the cover and the adhesive-restricting portion.

7. The display apparatus of claim 1, wherein a connecting member is disposed between the panel and the second accommodating portion to connect the panel and the second accommodating portion.

8. The display apparatus of claim 1, wherein the at least one first rib reinforcement structure is located on an inner side of the adhesive-restricting portion and contacts the optical adhesive.

9. The display apparatus of claim 1, wherein the at least one first rib reinforcement structure is located on an outer side of the adhesive-restricting portion.

10. The display apparatus of claim 1, wherein the adhesive-restricting portion further comprises at least one second rib reinforcement structure located at the at least one flat portion.

* * * * *